United States Patent [19]

Harp et al.

[11] 4,188,590
[45] Feb. 12, 1980

[54] CONICAL POWER COMBINER

[75] Inventors: Robert S. Harp, Westlake Village; Kenneth J. Russell, Thousand Oaks, both of Calif.

[73] Assignee: Hughes Aircraft Company, Culver City, Calif.

[21] Appl. No.: 855,054

[22] Filed: Nov. 25, 1977

[51] Int. Cl.² ............................................. H03B 7/14
[52] U.S. Cl. ..................................... 331/56; 331/101
[58] Field of Search ................... 331/56, 96, 101, 102, 331/107 R, 107 G, 107 T

[56] References Cited

U.S. PATENT DOCUMENTS

| | | | |
|---|---|---|---|
| 3,378,789 | 4/1968 | Gerlach | 331/56 |
| 3,582,813 | 6/1971 | Hines | 331/56 |
| 3,628,171 | 12/1971 | Kurokawa | 331/56 |
| 3,662,285 | 5/1972 | Rucker | 331/56 |
| 3,873,934 | 3/1975 | Oltman, Jr. et al. | 331/56 |
| 3,931,587 | 1/1976 | Harp et al. | 331/56 |
| 4,075,578 | 2/1978 | Dydyk | 331/56 |

*Primary Examiner*—John Kominski
*Attorney, Agent, or Firm*—William J. Bethurum; W. H. MacAllister

[57] ABSTRACT

The specification describes a solid state microwave power combiner wherein a plurality of solid state power generating devices are mounted between adjacent conical support and housing structures. These structures define the microwave electrical circuits for these devices, and also as provide a waveguiding region for propagating energy from these devices to a common output line. Both the support and housing structures have their apexes integrally joined, respectively, to input and output conductors of a common output coaxial line used for coupling power out of the combiner. This novel geometrical configuration minimizes the electrical distance between the power generating devices and the coaxial output line, maximizes the packing density of the structure and optimizes the electrical performance of RF termination elements for these devices.

19 Claims, 13 Drawing Figures

CONICAL POWER COMBINER

FIELD OF THE INVENTION

This invention relates generally to microwave power combiners and more particularly to a novel non-resonant, broadband power combining structure for coupling a plurality of solid state power generating devices to a common coaxial output line.

BACKGROUND

There has been substantial interest in recent years in maximizing the combined output powers from a plurality of solid state power sources, such as IMPATT and TRAPATT diodes mounted in a variety of power combining arrangements. Such interest has been stimulated in part by the increasing number of applications which require relatively lightweight and densely packed solid state power sources for generating high levels of microwave and millimeter wave power. For example, a signal transmitter on board a guided missile or a communications satellite has need for a high power solid state oscillators and amplifiers useful for the generation and amplification of microwave and millimeter wave energy, and solid state power combiner-type oscillators and amplifiers having the above-described characteristics are ideally suited for this purpose. Whereas traveling wave tubes (TWT's) have generally performed satisfactorily for this purpose in the past, there have nevertheless been continuing efforts to eliminate the dependence of the above electronic gear upon traveling wave tubes. Thus, there has been a trend to favor the all-solid-state type of power sources with their attendant advantages of increased reliability, lower cost, and their requirement for less space and weight in these high performance electronic applications.

Evidence of successful efforts in the development of microwave power combiners may be found in the widely copied IMPATT diode-type cylindrical power combiners built by the Hughes Aircraft Company of Culver City, California and patented by Robert S. Harp et al in U.S. Pat. No. 3,931,587, issued Jan. 6, 1976. However, this patented cylindrical power combiner is a narrow band, resonant cavity type of combiner, whereas the present invention to be described is directed to a wide-band non-resonant power combiner structure with improved electrical performance and certain advantages over this earlier patented combiner.

Prior attempts have been made to develop a solid state non-resonant wide-band power combiner structure, and these attempts include the proposed so-called radial line combiner. In the proposed radial line combiner, a plurality of solid state power generating devices are radially disposed around a central coaxial output line and are electrically coupled thereto for combining the output powers of these devices at a single location. One such proposed radial line combiner is disclosed by Marion E. Hines in U.S. Pat. No. 3,582,813 issued June 1, 1971 and assigned to Microwave Associates, Inc. of Burlington, Massachusetts. However, to the best of our knowledge, these prior radial line type of power combiners, including the combiner disclosed in U.S. Pat. No. 3,582,813, have never been made commercially acceptable. Furthermore, the abrupt radial-to-coaxial electrical transition in the power combiner proposed in U.S. Pat. No. 3,582,813 is not an optimum packaging configuration for accomodating impedance matching, biasing, tuning, and RF termination elements required by these types of power combiners.

THE INVENTION

The general purpose of this invention is to provide a new and improved broadband non-resonant microwave power combiner having most, if not all, of the advantages of prior art radial line-type power combiners and which simultaneously overcomes a number of their significant disadvantages of the type described above. To accomplish this purpose, we have conceived and built a novel conical microwave power combiner which includes, among other features, a conical support structure having an apex region and a conical surface extending from the apex region for receiving a plurality of selectively spaced solid state microwave power sources. A conical housing structure is concentrically mounted with respect to this conical support structure and has one of its surface areas facing the conical surface of the support structure and spaced therefrom to define an interior conical waveguide energy propagating region. An inner coaxial conductor is joined to the apex region of the conical support structure, whereas an outer coaxial conductor is integral with the conical surface area (or areas) of the conical housing structure, and these coaxial conductors form a common output coaxial line for the combiner. The plurality of microwave power sources are selectively disposed at predetermined locations on the conical surface of the support structure, and microwave circuit means are electrically connected and coupled to these power sources for energizing same and providing the optimum impedance matching and tuning for these sources for maximizing power transfer to the output coaxial line.

Using our above-described configuration, the electrical distance between the microwave power sources and the output coaxial line is minimized, and further the electrical performance of the combiner is maximized as a result of an optimum mounting arrangement for a plurality of termination elements opposite the respective power sources. Additionally, the overall packing density of the power combiner is maximized as a result of the above conical configuration and the smooth transition from such configuration into the common output coaxial line.

Accordingly, it is an object of the present invention to provide a new and improved broadband non-resonant power combiner operative at high levels of output power and with an improved electrical performance.

Another object is to provide a power combiner of the type described having an improved packing density.

A further object is to provide a power combiner of the type described having improved RF termination and spurious wave absorption charcteristics.

Another object is to provide a power combiner of the type described having improved impedance matching and tuning characteristics for a plurality of solid state microwave power sources therein.

A feature of this invention is the provision of an improved mode absorbing filter which is mounted within the conical housing of the power combiner in a manner so as to subtend a large angle, $\theta$, from the active power sources thereof. This filter is operative for absorbing waves generated by spurious high order modes in the combiner, with a minimum of coupling to the output coaxial line.

Another feature of this invention is the provision of a minimum electrical distance between a plurality of IM- PATT diode power sources and the coaxial output line of the combiner, while simultaneously providing a suitable housing for the biasing, adjustable tuning, impedance matching and mode absorbing filter elements of the structure.

Another feature of this invention is the provision of a maximum adjustability of tuning for a plurality of IMPATT power sources, with easy tuning accessibility at the exterior of the combiner.

These and other objects and features of this invention will become more readily apparent in the following description of the accompanying drawings.

DRAWINGS

DESCRIPTION OF THE PREFERRED EMBODIMENT

Figure 1:
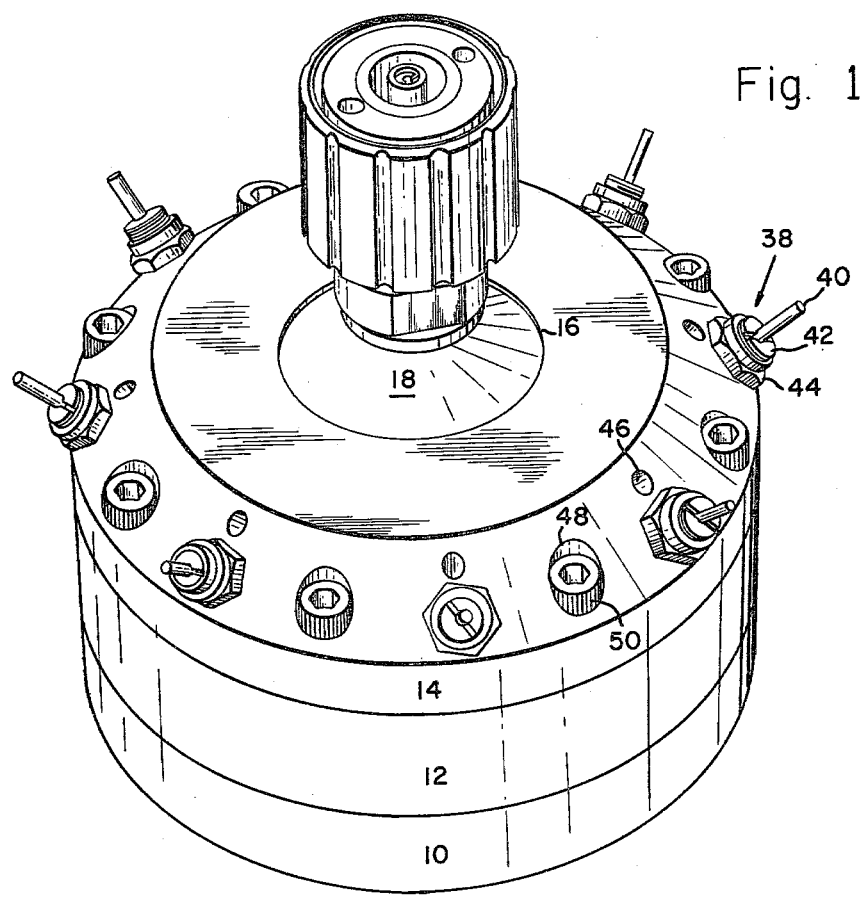
FIG. 1 is an isometric view of the power combiner embodying the present invention.
Figure 2:
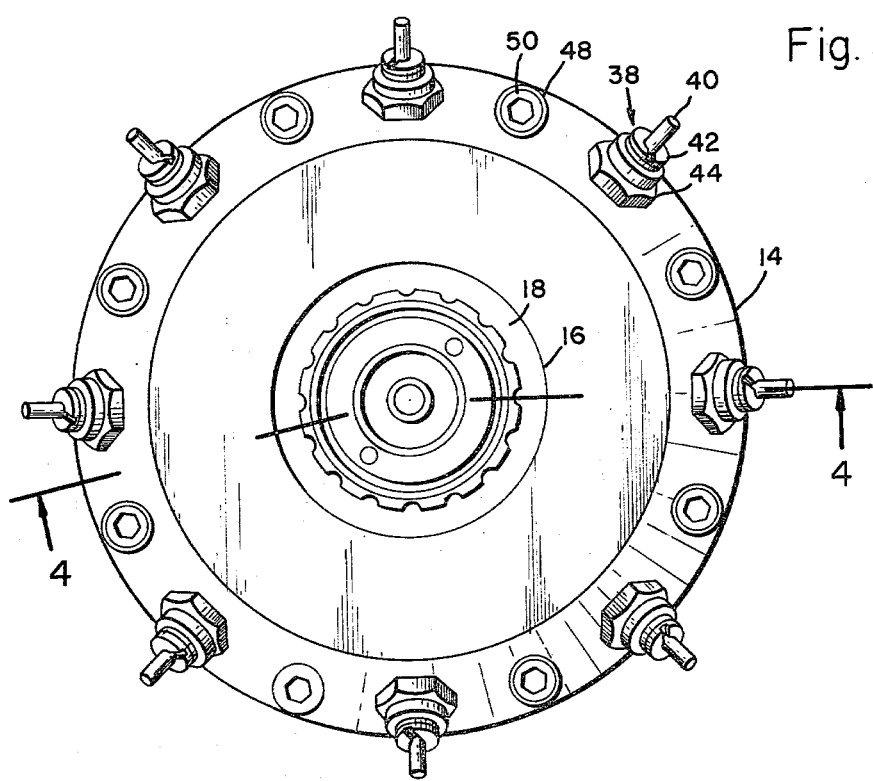
FIG. 2 is a plan view of the power combiner of FIG. 1 showing the biasing and tuning elements of the structure concentrically spaced around a common coaxial output line.
Figure 3:
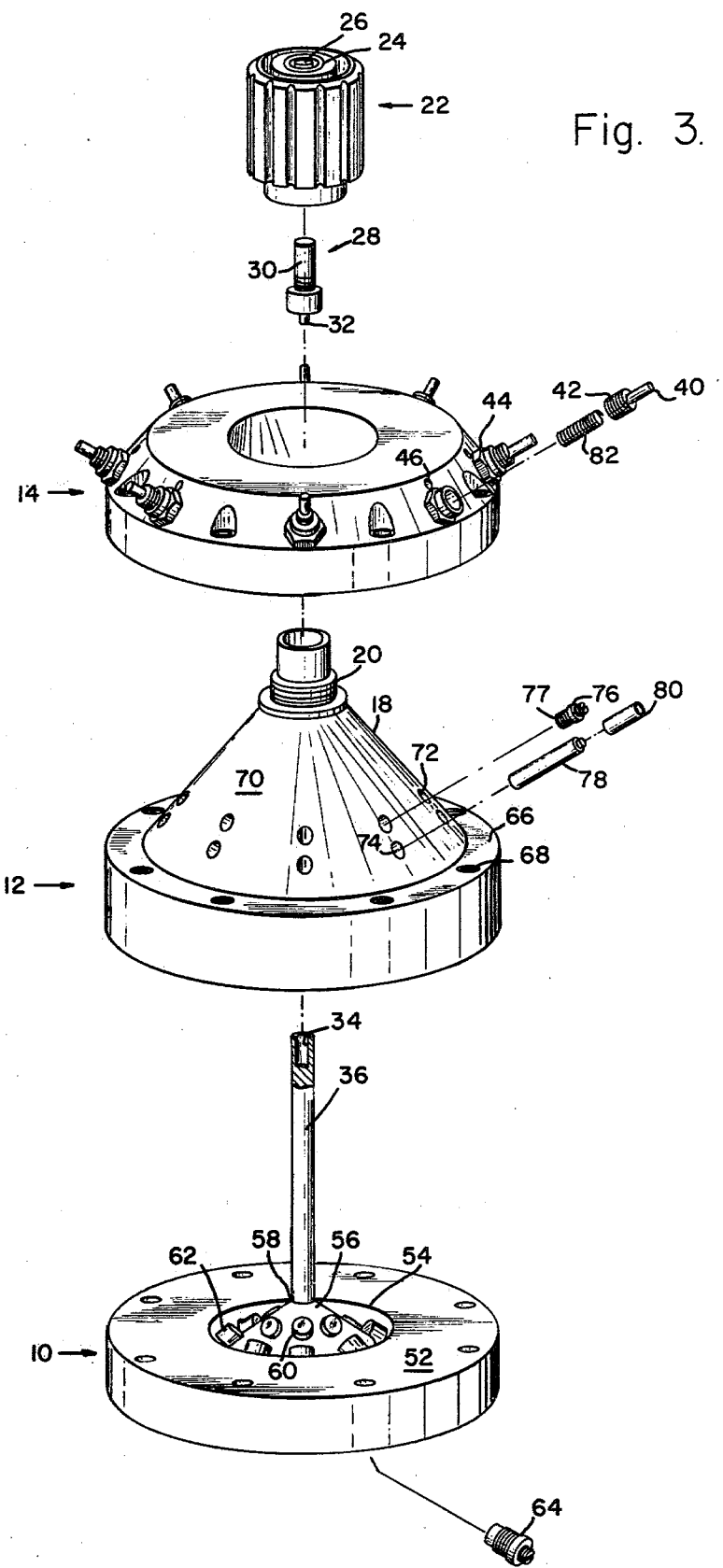
FIG. 3 is an exploded view of the power combiner in FIG. 1.

Referring now to FIGS. 1, 2, and 3, the assembled conical power combiner according to the invention includes a conical conductive base or support member 10 which is typically machined from a suitable tellurium-copper alloy and is configured to receive thereon an intermediate conical housing member 12. The intermediate conical housing member 12 is also conductive and may also be of a tellurium copper alloy. The support and housing structures 10 and 12 have facing, but spaced apart, conical surfaces which are shown in more detail in FIGS. 3, 4 and 5, and these surfaces form part of the microwave circuits of the power combiner to be described.

An insulating cover member 14 has a cylindrical and partially tapered outer contour which is concentric with both the intermediate and base members 12 and 10, respectively, and it further includes a central opening 16 thereof through which a conical surface 18 of member 12 extends. This conical surface 18 is an integral portion of the intermediate housing structure 12 and includes a vertical threaded section 20 which is shown in more detail in FIGS. 3, 4 and 5. A coaxial output connector 22 threadedly engages the section 20 of the intermediate housing structure 12, and includes a central opening 24 into which its own inner coaxial conductor 26 is positioned as shown in FIG. 3. The output connector 22 of the power combiner is adapted to receive an intermediate adaptor pin or connector 28 having an upper section 30 which connects directly to the center conductor 26 of the output connector 22. The intermediate connector 28 further includes a lower screw section 32 which extends into a central threaded hole 34 of the central conductor 36 of the base member 10.

The insulating cover member 14 includes a plurality of bias connectors which are generally designated 38, and each connector 38 includes a DC bias pin 40 which extends through a central opening in a bias connector adjustment screw 42. The adjustment screw 42 is in turn threaded into a larger outer screw 44 which itself is threaded into an opening in the tapered surface portion of the cover member 14. A plurality of passageways 46 in the cover member 14 are located directly adjacent to and above the bias connectors 38, and these passageways 46 allow access to a plurality of capacitive tuning screws to be described. These capacitive tuning screws are threaded into a plurality of openings, respectively, in the intermediate housing member 12 and provide variable shunt capacitive coupling to the base member. The insulating cover 14 also includes a plurality of openings 48 therein which are spaced between the bias connectors 38 as shown and are adapted to receive a plurality of long assembly screws 50. These assembly screws 50 extend vertically through the openings 48 and through each of the major members 10, 12, and 14 of the power combiner and into threaded engagement with the base support member 10 to firmly secure these members in place as shown in FIG. 1.

Referring now in more detail to FIG. 3, the base or support member 10 includes an outer annular disc-shaped portion 52 which has a central annular opening 54 therein. The base member 10 is machined to include a conical support member or section 56 which is integral with the disc-shaped portion 52, and the apex region 58 of the conical support member 56 is integral with the vertical central conductor 36. This central conductor 36 forms part of the output coaxial line for the power combiner. The surface of the conical support member 56 includes a plurality of solid state power sources 60, such as IMPATT diodes, which are selectively spaced at chosen locations thereon. A plurality of semicylindrical openings 62 are grooved in the conical support member 56 for receiving a corresponding plurality of inductive tuning screws 64 to be further described.

Figure 4:
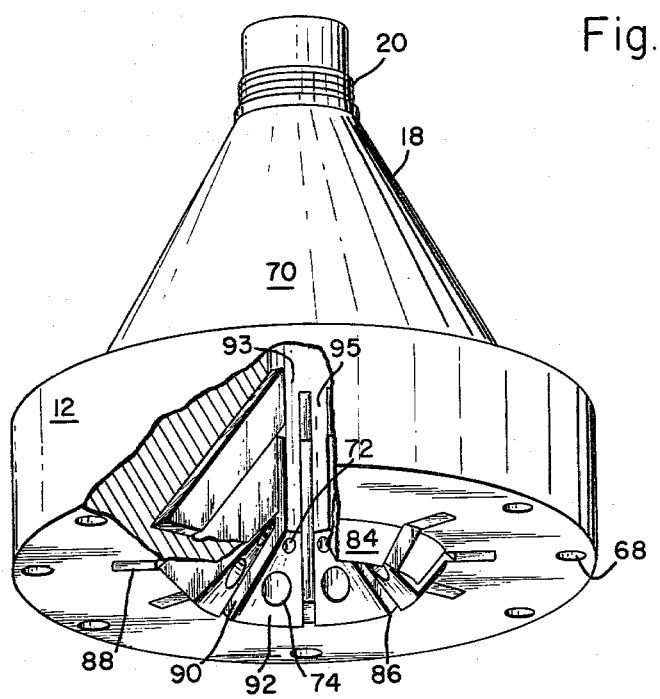
FIG. 4 is an enlarged isometric and partially fragmented view of the conical housing structure of FIG. 3.

The intermediate conical housing structure 12 also includes an outer disc-shaped portion 66 having a plurality of cylindrical openings 68 therein for receiving the assembly screws 50. A cone-shaped housing structure 70 extends upwardly as shown from the disc-shaped portion 66, and the interior surface areas of the housing structure 70 are machined, as shown in FIG. 4, to form portions of the microwave circuits for the plurality of solid state power sources 60. The conical housing structure 70 also includes openings 72 and 74 therein for receiving, respectively, the previously mentioned capacative tuning screws 76 and the cylindrical RF filter and insulator members 78 and 80, the latter of which form part of the DC bias connection for the individual solidstate power sources 60 of the combiner. An elongated spring 82 is positioned as indicated in FIG. 3 between one end of the RF filter member 78 and one end of the DC bias connector 40, 42 and is surrounded by the cylindrical insulator member 80. The abovedescribed members are shown in more detail in FIG. 5 below.

The underside or interior geometrical configuration of the intermediate conical housing member 12 may be seen in greater detail in the partially cut-away view in FIG. 4. This structure includes a slotted conical section 84 which extends downwardly as shown and has a plurality of radial slots 86 which, upon assembly, are electrically coupled in individual microwave circuits with the individual IMPATT diode sources 60. These slots 86 include ferrite termination elements 88 which are housed by only an outer region of each slot, and these ferrite termination elements 88 are also known as RF absorber elements. These elements serve to absorb RF energy which is generated by spurious high order modes in the microwave circuit associated with each IMPATT diode 60. Each of the slots 86 has a front portion 90 thereof which is open and defines an intermediate waveguide coupling region between each RF absorber element 88 and each of the plurality of IMPATT diodes located at the other end of each individual microwave circuit within the power combiner. These microwave circuits are examined in greater detail below with reference to FIG. 5. The tapered sections 92 of the downwardly extending conical member 84 include the previously identified passages 74 and 72 for receiving, respectively, the DC bias connector and capacitive tuning elements which form part of each IMPATT diode microwave circuit. The plurality of interior vertical wall surfaces 93 and 95 which completely surround the inner coaxial conductor 36, previously identified, function as the outer coaxial conductor the coaxial output line of the combiner.

Figure 5:
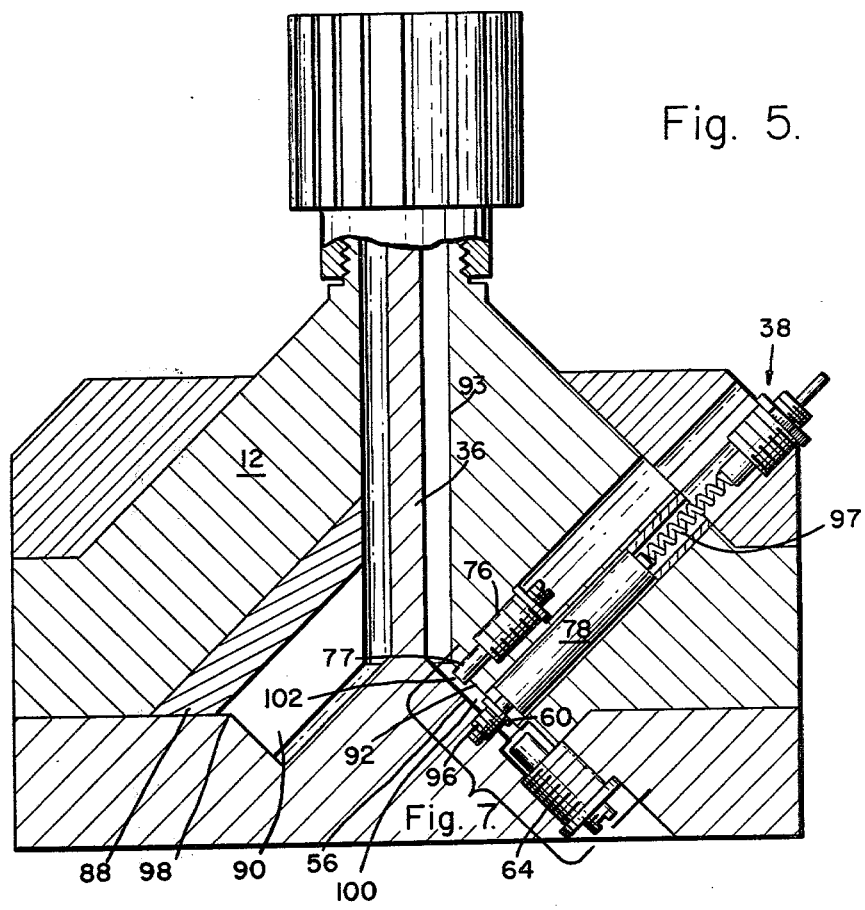
FIG. 5 is a partial cross-section view of the combiner of FIGS. 1 and 2, taken along lines 5—5 of FIG. 2.

Referring now to FIG. 5, which is a partial cross-section view taken along lines 4—4 of FIG. 2, the conical support surface 56 of the base member 10 and the opposing conically-shaped members or regions 88, 90 and 92 define the surface boundaries for each individual microwave circuit including an IMPATT diode. Each such circuit serves to match the impedance of each IMPATT diode 60 with the output coaxial line defined in part by the inner coaxial conductor 36 and in part by the vertical interior walls 93, 95 of the intermediate housing structure 12. Advantageously, the individual IMPATT diodes 60 may be soldered or screwed into a plurality of recessed areas or cavities on the conical support surface 56 of the base member 10. These IMPATT diodes 60 and the cavities in which they are mounted are aligned with the DC bias connectors 38 and their associated DC bias circuit members previously described. The DC bias connectors 38, together with the spring member 97 (inside the insulating sleeve 80) and the RF filter member 78 provide a direct DC connection between each IMPATT diode 60 and a DC supply voltage for energizing these avalanche diodes.

Figure 6:
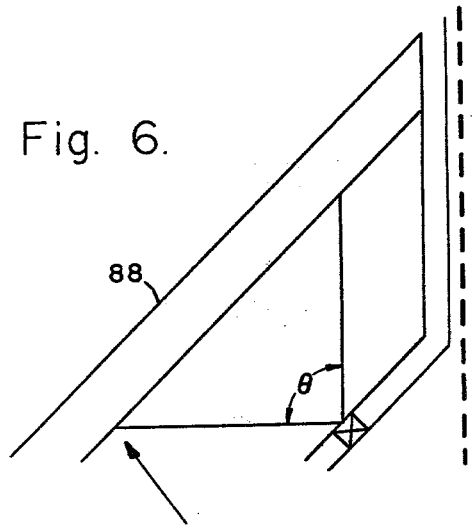
FIG. 6 is an enlarged and fragmented cross-section view of the mode filter of FIG. 5 showing the angle it subtends with respect to its corresponding power source.

Referring now to FIG. 6, the RF absorber material 88 is positioned in the outermost region in the slots 86 and at the particular angle $\theta$ shown so as to subtend a large angle $\theta$ of approximately 90 degrees with respect to the individual IMPATT diode 60 which it faces. The advantage of this feature is that each IMPATT diode 60 is electromagnetically coupled to a maximum extent to each of the absorber elements 88 to thereby insure a maximum suppression of the spurious high order modes within each individual microwave circuit associated with each IMPATT diode 60. At the same time, however, the electrical distance between each IMPATT diode 60 (and its associated microwave circuit) and the output coaxial line is minimized, and this feature both enhances the power combiner operating efficiency and maximizes its packing density.

Figure 7:
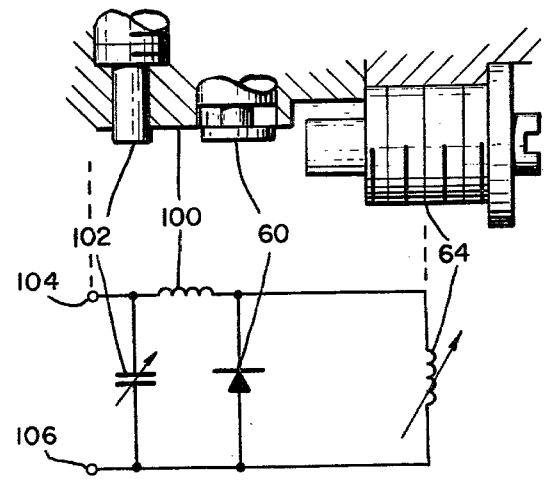
FIG. 7 shows an enlarged cross-section view of the microwave energy propagating circuit for each IMPATT diode, and its corresponding electrical equivalent circuit with variable inductance and capacitance parameters for tuning purposes.

Referring now to FIG. 7, the section 100 of the wave-propagating region between opposing conical surfaces 56 and 92 exhibits an equivalent series inductance for each microwave circuit. Also, a variable shunt capacitance 102 is provided between the end 77 of the capacitive tuning screw 76 and the area of the conical surface 56 which it faces. The inductive tuning screw 64 provides a variable shunt inductance for the IMPATT diode 60 as shown in FIG. 7, so that by properly selecting the value of series inductance 100 and by varying the inductance and capacitive parameters 64 and 102 as indicated in FIG. 7, the impedance of this equivalent circuit in FIG. 7 can be matched to the load impedance for purposes of maximum power transfer. Typically, the equivalent circuit in FIG. 7 will be used to transform a relatively low, e.g., 2 ohms, IMPATT diode impedance to a much higher, e.g., 50 ohms, output coaxial line impedance. Additionally, the variable inductance 64 may also be used to control the precise power combiner output frequency as it is used as means for controlling the equivalent circuit impedance of FIG. 7.

Thus, the particular construction of the conical wave-guide and microwave circuit shown in FIGS. 5 and 7 provides multiple and simultaneous functions and advantages during power combiner operation. That is, the very conical nature and geometry of this waveguide structure per se minimizes the electrical distance between the power sources and the output coaxial line, while simultaneously affording an optimum mounting arrangement, as described, for the spurious mode suppressors 88 for each microwave circuit. Such arrangement thus maximizes the space available for mounting the mode suppressors 88 and also enhances their effectiveness. At the same time, these conical support and housing surfaces 56 and 92 not only define an energy propagating region for each microwave circuit, but also serve to accommodate (in a high packing density) the individual components in FIG. 7 which provide the necessary variable microwave circuit parameters for properly impedance matching each IMPATT diode to the common output coaxial line.

Although the equivalent circuit of FIG. 7 represents the microwave circuit for a single IMPATT diode, it will be understood that a complete equivalent circuit (not shown) for the assembled power combiner will include a plurality of these equivalent circuits in FIG. 7 connected in parallel across the output terminals 104 and 106. These output terminals 104 and 106, of course, are electrically connected into the output coaxial line 36 and 93 in FIG. 5 so as to couple all of the IMPATT diodes 60 electrically in parallel and to a common output coaxial line.

In addition to the above advantages of the present invention, the conical power combiner construction described herein eliminates the abrupt radial-to-coaxial transition in prior proposed radial line power combiners such as the one described in U.S. Pat. No. 3,582,813. Instead, in accordance with the power combiner construction herein, the vertical coaxial output line intersects each waveguide coupling region at an angle of about 135 degrees. This feature provides a relatively smooth impedance transition between each individual IMPATT diode microwave circuit and the output coaxial line.

Various modifications may be made in the above-described embodiment without departing from the true scope of this invention. For example, the particular construction and location of each component forming part of each individual microwave circuit may be varied in both geometry and position within the conical housing structure in order that the power combiner meet certain particular specifications. Additionally, the spacing between the conical support and housing structures defining the individual microwave coupling regions and the particular size and shape of the output coaxial line may also be varied for certain power combiner applications within the scope of the present invention. Likewise, the size and shape of the slots receiving the spurious mode suppressors may be varied and tailored to meet certain specifications, and in fact these slots may either be offset or staggered with respect to each microwave circuit to which they are coupled (as shown herein), or the slots may be machined in the conical housing structure so as to be directly aligned with each IMPATT diode and microwave circuit to which they are coupled.

What is claims is:

1. A microwave power combiner comprising:
   (a) a conical support structure having an apex region and a conical surface extending from said apex region for receiving a plurality of selectively spaced power sources,
   (b) a conical housing structure having a conical surface area or areas thereof facing said conical surface of said support structure and spaced therefrom to define a common waveguide energy propagating region for said power sources,
   (c) an inner coaxial conductor joined to said apex region of said conical support structure,
   (d) an outer coaxial conductor surrounding said inner coaxial conductor to define an output coaxial line and further joined to said conical surface area or areas of said housing structure,
   (e) a plurality of microwave power sources selectively disposed at predetermined locations on said conical surface of said support structure, and
   (f) microwave circuit means electrically connected and coupled to said power sources for energizing said power sources and for coupling energy from said power sources and via said waveguide region to said coaxial line, whereby the electrical distance between said power sources and said coaxial line is minimized.

2. The power combiner defined in claim 1 wherein said microwave circuit means include a plurality of mode absorbing filters housed in predetermined, spaced apart locations in said housing structure and electrically coupled to said plurality of power sources, respectively, for absorbing waves generated by spurious high order modes within said power combiner and with a minimum of electrical coupling to said coaxial output line.

3. The power combiner defined in claim 2 wherein said mode absorbing filters are mounted adjacent to said conical surface of said housing structure so as to subtend a chosen angle, $\theta$, with respect to said power sources to thereby optimize the mode absorption characteristics of said combiner.

4. The combiner defined in claim 1 wherein said microwave circuit means includes a plurality of individual tuning circuit for each microwave power source, and each tuning circuit comprises:
   (a) a variable short positioned at one end of said waveguide region and adjacent to said microwave power sources for varying the inductive tuning on said source,
   (b) an RF filter interconnected in said housing structure between said microwave power source and a DC bias connector for providing a DC energizing voltage for said microwave power source, and
   (c) a variable tuning screw in said housing structure and positioned at the other end of said waveguide region for varying the capacitive tuning for said microwave power source, whereby variable inductive and capacitive tuning are provided along the length of said waveguide region to vary the equivalent circuit parameters for said microwave circuit means to thereby control the impedance matching characteristics between said microwave power source and said coaxial output line.

5. The combiner defined in claim 4 wherein said variable short is adjustable parallel to the conical surface of said support member and said RF filter and said variable tuning screw are adjustable perpendicular to the conical surface of said support member, to thereby provide parallel and series inductance and capacitance equivalent circuit parameters for said power source.

6. The combiner defined in claim 4 wherein said mode absorbing filters are mounted adjacent to said conical surface of said housing structure so as to subtend a chosen angle, $\theta$, with respect to said power sources to thereby improve the overall mode absorption characteristics of said combiner.

7. A conical microwave and millimeter wave power combiner comprising:
   (a) a first, centrally disposed conductive member including an elongated conductor forming an inner conductor of an output coaxial line and a conically shaped support member integral therewith,
   (b) a second conductive member having an opening therein concentric with said elongated conductor and forming an outer conductor of said coaxial line, said second conductive member further having a conical surface area surrounding said conical surface area of said support member and spaced therefrom to form a waveguide coupling region, said second conductive member further having a plurality of preconfigured slots therein receiving a corresponding plurality of RF absorber elements which absorb waves generated in said waveguide energy coupling region by spurious high order waveguide modes,
   (c) a plurality of microwave power sources selectively disposed at chosen locations on said conical surface of said support member and electrically coupled through said waveguide coupling region to said output coaxial line, and
   (d) microwave circuit means electrically connected and coupled to said microwave power sources for providing bias and tuning therefor and for impedance matching said plurality of microwave power sources to said output coaxial line, whereby power outputs from said plurality of microwave power sources are combined in said coaxial output line, and the distance between said power sources and said coaxial line is minimized while maximizing the angle subtended by said RF absorber elements with respect to the location of said plurality of microwave power sources, thereby maximizing the spurious mode absorption capability of said absorber elements.

8. The power combiner defined in claim 7 wherein said RF absorber elements have outer surfaces which subtend an angle, $\theta$, from said power sources to thereby optimize the mode absorption characteristics of said combiner.

9. The power combiner defined in claim 7 wherein said microwave circuit means includes a plurality of individual tuning circuits for each microwave power source, and each tuning circuit comprises:
(a) a variable short positioned at one end of said waveguide region and adjacent to said microwave power source for varying the inductive tuning on said source,
(b) an RF filter interconnected in said housing between said microwave power source and a DC bias connector for providing a DC energizing voltage for said microwave power source, and
(c) a variable tuning screw positioned at the other end of said waveguide region for varying the capacitive tuning for said microwave power source, whereby variable inductive and capacitive tuning are provided along the length of said waveguide region to vary the equivalent circuit parameters for said microwave circuit means to thereby control the impedance matching characteristics between said microwave power source and said coaxial output line.

10. The combiner defined in claim 9 wherein said variable short is adjustable parallel to the conical surface of said support member and said RF filter and said variable tuning screw are adjustable perpendicular to the conical surface of said support member, to thereby provide parallel and series inductance and capacitance equivalent circuit parameters for said power source.

11. The power combiner defined in claim 10 wherein said RF absorber elements have outer surface which subtend an angle, $\theta$, from said power sources to thereby optimize the mode absorption characteristics of said combiner.

12. A microwave and millimeter wave power combiner comprising:
(a) a first, centrally disposed conductive member including an elongated conductor forming an inner conductor of an output coaxial line and a power device support member joined thereto at a chosen angle greater than 90°,
(b) a second conductive member having an opening therein concentric with said elongated conductor and forming an outer conductor of said coaxial line, said second conductive member further having a surface area surrounding and substantially parallel to said support member and spaced therefrom to form a waveguide coupling region, said second conductive member further having a plurality of preconfigured slots therein receiving a corresponding plurality of RF absorber elements which absorb waves generated in said waveguide energy coupling region with spurious high order waveguide modes,
(c) a plurality of microwave power devices selectively disposed at chosen locations on said support member and electrically coupled through said waveguide coupling region to said output coaxial line, and
(d) microwave circuit means electrically connected and coupled to said microwave power devices for providing bias and tuning therefor and for impedance matching said plurality of power devices to said output coaxial line, whereby power outputs from said plurality of microwave power devices are combined in said coaxial output line, and the angle at which said waveguide coupling region intersects said coaxial line provides a smooth impedance transition therebetween.

13. The power combiner defined in claim 12 wherein said waveguide coupling region intersects said coaxial line at an angle of about 135 degrees.

14. A microwave power combiner comprising:
(a) a support structure having an apex region and a surface extending from said apex region for receiving a plurality of selectively spaced power sources,
(b) a housing structure having a surface area thereof facing said surface of said support structure and spaced therefrom to define a common waveguide energy propagating region for said power sources,
(c) an inner coaxial conductor joined to said apex region of said support structure,
(d) an outer coaxial conductor surrounding said inner coaxial conductor to define an output coaxial line and further joined to said surface area of said housing structure at a chosen angle greater than 90 degrees,
(e) a plurality of microwave power sources selectively disposed at predetermined locations on said surface of said support structure, and
(f) microwave circuit means electrically connected and coupled to said power sources for energizing said power sources and for coupling energy from said power sources and via said waveguide region to said coaxial line.

15. The power combiner defined in claim 14 wherein said microwave circuit means include a plurality of mode absorbing filters housed in predetermined, spaced apart locations in said housing structure and electrically coupled to said plurality of power sources, respectively, for absorbing waves generated by spurious high order modes within said power combiner and with a minimum of electrical coupling to said coaxial output line.

16. A microwave power combiner comprising:
(a) a conical support structure having an conical surface,
(b) a conical housing structure having a conical surface area thereof facing said conical surface of said support structure and spaced therefrom to define a common waveguide energy propagating regions,
(c) a plurality of microwave power sources selectively disposed at predetermined locations on said conical surface of said support structure,
(d) microwave circuit means electrically connected and coupled to said power sources for energizing said power sources and for coupling energy from said power sources into said waveguide energy propagating region, and
(e) means including an output coaxial line connected to said conical support and housing structures for coupling power from said common waveguide energy propagating regions and thereby combining the output powers from all of said microwave power sources.

17. The power combiner defined in claim 16 wherein said microwave circuit means include a plurality of mode absorbing filters housed in predetermined, spaced apart locations in said housing structure and electrically coupled to said plurality of power sources, respectively, for absorbing waves generated by spurious high order modes within said power combiner and with a minimum of electrical coupling to said coaxial output line.

18. The power combiner defined in claim 17 wherein said mode absorbing filters are mounted adjacent to said conical surface of said housing structure so as to subtend a chosen angle, $\theta$, with respect to said power sources to thereby optimize the mode absorption characteristics of said combiner.

19. The combiner defined in claim 18 wherein said microwave circuit means includes a plurality of individual tuning circuits for each microwave power source, and each tuning circuit comprises:
 (a) a variable short positioned at one end of said waveguide region and adjacent to said microwave power sources for varying the inductive tuning on said source,
 (b) an RF filter interconnected in said housing structure between said microwave power source and a DC bias connector for providing a DC energizing voltage for said microwave power source, and
 (c) a variable tuning screw in said housing structure and positioned at the other end of said waveguide region for varying the capacitive tuning for said microwave power source, whereby variable inductive and capacitive tuning are provided along the length of said waveguide region to vary the equivalent circuit parameters for said microwave circuit means to thereby control the impedance matching characteristics between said microwave power source and said coaxial output line.

* * * * *